United States Patent
Cordero et al.

(10) Patent No.: US 9,535,784 B2
(45) Date of Patent: ***Jan. 3, 2017

(54) SELF MONITORING AND SELF REPAIRING ECC

(71) Applicant: International Business Machines Corporation, Armonk, NY (US)

(72) Inventors: Edgar R. Cordero, Round Rock, TX (US); Timothy J. Dell, Colchester, VT (US); Joab D. Henderson, Pflugerville, TX (US); Jeffrey A. Sabrowski, Leander, TX (US); Anuwat Saetow, Austin, TX (US); Saravanan Sethuraman, Bangalore (IN)

(73) Assignee: International Business Machines Corporation, Armonk, NY (US)

(*) Notice: Subject to any disclaimer, the term of this patent is extended or adjusted under 35 U.S.C. 154(b) by 29 days.

This patent is subject to a terminal disclaimer.

(21) Appl. No.: 14/623,706

(22) Filed: Feb. 17, 2015

(65) Prior Publication Data

US 2015/0178147 A1 Jun. 25, 2015

Related U.S. Application Data

(63) Continuation of application No. 13/781,807, filed on Mar. 1, 2013, now Pat. No. 8,996,953.

(51) Int. Cl.
| | |
|---|---|
| *G01R 31/28* | (2006.01) |
| *G06F 11/10* | (2006.01) |
| *G06F 11/28* | (2006.01) |
| *H03M 13/29* | (2006.01) |
| *G06F 11/20* | (2006.01) |

(52) U.S. Cl.
CPC ........... *G06F 11/10* (2013.01); *G06F 11/1048* (2013.01); *G06F 11/2017* (2013.01); *G06F 11/28* (2013.01); *H03M 13/29* (2013.01)

(58) Field of Classification Search
None
See application file for complete search history.

(56) References Cited

U.S. PATENT DOCUMENTS

| | | | |
|---|---|---|---|
| 4,412,281 A | 10/1983 | Works | |
| 4,792,955 A | 12/1988 | Johnson et al. | |
| 4,967,347 A | 10/1990 | Smith et al. | |
| 5,157,780 A | 10/1992 | Stewart et al. | |
| 6,397,357 B1 | 5/2002 | Cooper | |
| 7,492,719 B2* | 2/2009 | Lim | H04L 1/243 370/241.1 |

(Continued)

OTHER PUBLICATIONS

U.S. Appl. No. 13/781,807, entitled "Self Monitoring and Self Repairing ECC", filed Mar. 1, 2013.

*Primary Examiner* — M. Mujtaba Chaudry
(74) *Attorney, Agent, or Firm* — Isaac J. Gooshaw (57) ABSTRACT

Exemplary embodiments of the present invention disclose a method and system for monitoring a first Error Correcting Code (ECC) device for failure and replacing the first ECC device with a second ECC device if the first ECC device begins to fail or fails. In a step, an exemplary embodiment performs a loopback test on an ECC device if a specified number of correctable errors is exceeded or if an uncorrectable error occurs. In another step, an exemplary embodiment replaces an ECC device that fails the loopback test with an ECC device that passes a loopback test.

20 Claims, 9 Drawing Sheets

(56) References Cited

U.S. PATENT DOCUMENTS

| | | | |
|---|---|---|---|
| 7,900,118 B2 | 3/2011 | Chang et al. | |
| 8,086,915 B2* | 12/2011 | Bodrozic | G01R 31/31716 714/716 |
| 2001/0042230 A1 | 11/2001 | Williams et al. | |
| 2005/0022065 A1* | 1/2005 | Dixon | G06F 11/106 714/42 |
| 2007/0113150 A1* | 5/2007 | Resnick | G06F 11/106 714/763 |
| 2008/0307276 A1* | 12/2008 | Bodrozic | G01R 31/31716 714/719 |
| 2011/0035560 A1 | 2/2011 | Bodrozic et al. | |
| 2012/0072787 A1 | 3/2012 | Bodrozic et al. | |
| 2012/0246544 A1* | 9/2012 | Resnick | G06F 11/106 714/764 |
| 2013/0148437 A1 | 6/2013 | Bronner et al. | |

* cited by examiner

SELF MONITORING AND SELF REPAIRING ECC

FIELD OF THE INVENTION

The present invention relates generally to the design of memory and more specifically to the design of Error Correcting Code.

BACKGROUND

Error Correcting Code (ECC) is a technique that is commonly used to correct errors in semiconductor memory but may be used elsewhere. ECC is used with all forms of semiconductor memory but is especially beneficial in dynamic memory (DRAM) memories and to a lesser extent in static memory (SRAMs). DRAMs are more susceptible than SRAMs to soft errors (transitory) and hard errors (permanent) caused by a variety of sources, including energetic particles, electrical noise, microwaves, age, and high temperatures. An energetic particle (often a proton produced by a decayed cosmic ray neutron) can discharge small capacitors that store bits in a DRAM and can, in some cases, permanently damage semiconductor circuits. Airborne system designers pay particular heed to a risk from energetic particles whose prevalence increases greatly with altitude. A common form of ECC used with semiconductor memories is Single Error Correction Double Error Detection (SEC-DED) which can, as the name implies, detect and correct a single bit error and detect a double bit error. Usually a system is unaware of an occurrence of a single bit error but may try to clear a double bit error by retrying an access. If a double bit error cannot be cleared, an operating system is often notified by way of a machine check, which may then take an appropriate action. Many systems cannot recover from a double bit error in critical code, e.g., the kernel of an operating system. Some systems scrub memory by periodically reading and writing data to clean single bit soft errors from memory to reduce the likelihood that ECC will detect a double bit error.

When data is written to an ECC enabled memory, ECC logic examines a block of data bits, commonly 64-bits, and generates a block of bits based on the data bits, called check bits, that are stored with the data. A check bit is a parity bit generated on a combination of data bits, and each check bit is generated from a specific combination of data bits that is unique to each check bit. SEC-DED requires 8 check bits to be generated from and stored with a 64-bit block of data, therefore storing 72-bits. When the data is read, the check bits are read with the data and are processed by ECC logic to generate an error indicator, called a syndrome. A syndrome points to a flipped bit (in the data or check bits) if there is one, or may indicate that two erroneous bits exist somewhere in the 72-bits read. In an unlikely event that three or more bits are in error, an erroneous syndrome is generated that may erroneously indicate that a correct bit is incorrect or that the data is correct.

Double Error Correction (DEC) techniques exist but require 14 check bits to be generated and stored with 64-bits of data. Double Error Correction Triple Error Detection (DEC-TED) requires 15 check bits to be generated and stored with 64-bits of data. DEC or DEC-TED is used in situations that require extreme reliability and/or operation in hazardous environments, e.g., spacecraft exposed to radiation or in hardened weapons systems.

Byte correction codes are a type of ECC that is are often employed in memory systems with a memory organization that includes memory chips that provide byte accesses. In this case, a failed memory chip causes an entire byte of information to be incorrect. Byte-oriented error correction codes have been developed that provide single byte error correction and double byte error detection (SBC-DBD) to enable a system to continue operation with a failed memory chip. Other byte-oriented ECC techniques are possible.

SUMMARY

Exemplary embodiments of the present invention disclose a method and system for monitoring a first Error Correcting Code (ECC) device for failure and replacing the first ECC device with a second ECC device if the first ECC device begins to fail or fails. In a step, an exemplary embodiment performs a loopback test on an ECC device if a specified number of correctable errors is exceeded or if an uncorrectable error occurs. In another step, an exemplary embodiment replaces an ECC device that fails the loopback test with an ECC device that passes a loopback test.

DETAILED DESCRIPTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 1:
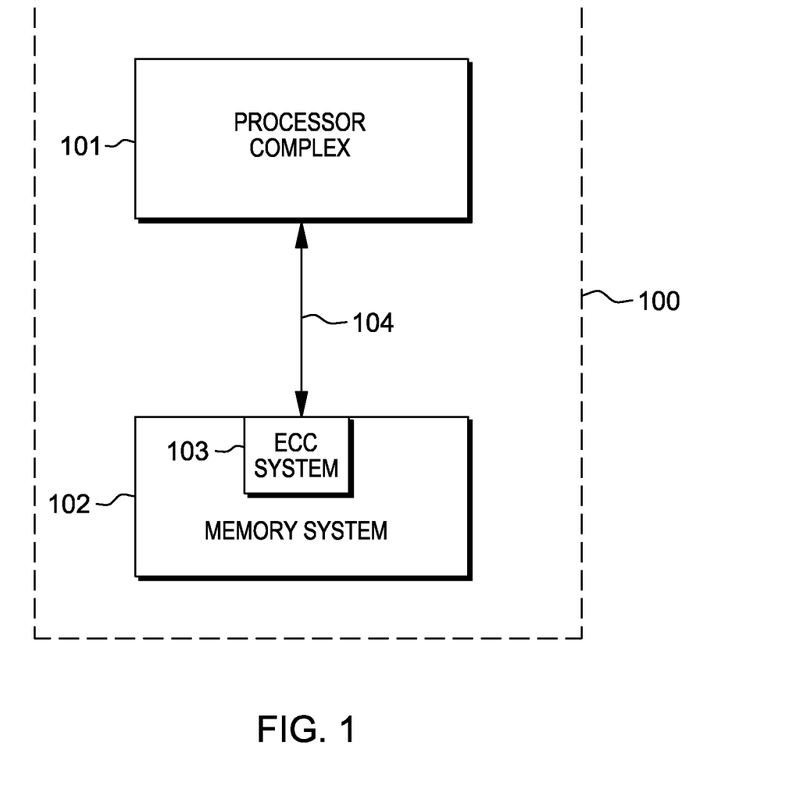
FIG. 1 is a block diagram of processor complex connected to a memory system that incorporates an Error Correcting Code system, in accordance with an embodiment of the present invention.

FIG. 1 depicts a computer system 100 in which a processor complex 101 is connected to a memory system 102 via a data bus 104. Processor complex 101 stores and retrieves data from memory system 102 as needed. Memory system 102 incorporates an Error Correcting Code (ECC) system 103 that can correct a single bit in data read from memory and can detect a double bit error in data read from memory. An ability to correct a single bit error and detect a double bit error is termed Single Error Correction Double Error Detection or SEC-DED. In an exemplary embodiment, ECC system 103 incorporates two ECC modules, ECC module A 201 and ECC module B 202, shown in FIG. 2, that can each independently perform SECDED with ECC logic 217 and ECC logic 218 respectively. In this embodiment, ECC module A 201 and ECC module B 202 are identical in design, but ECC module A 201 and ECC module B 202 may differ in design in other embodiments.

Figure 2:
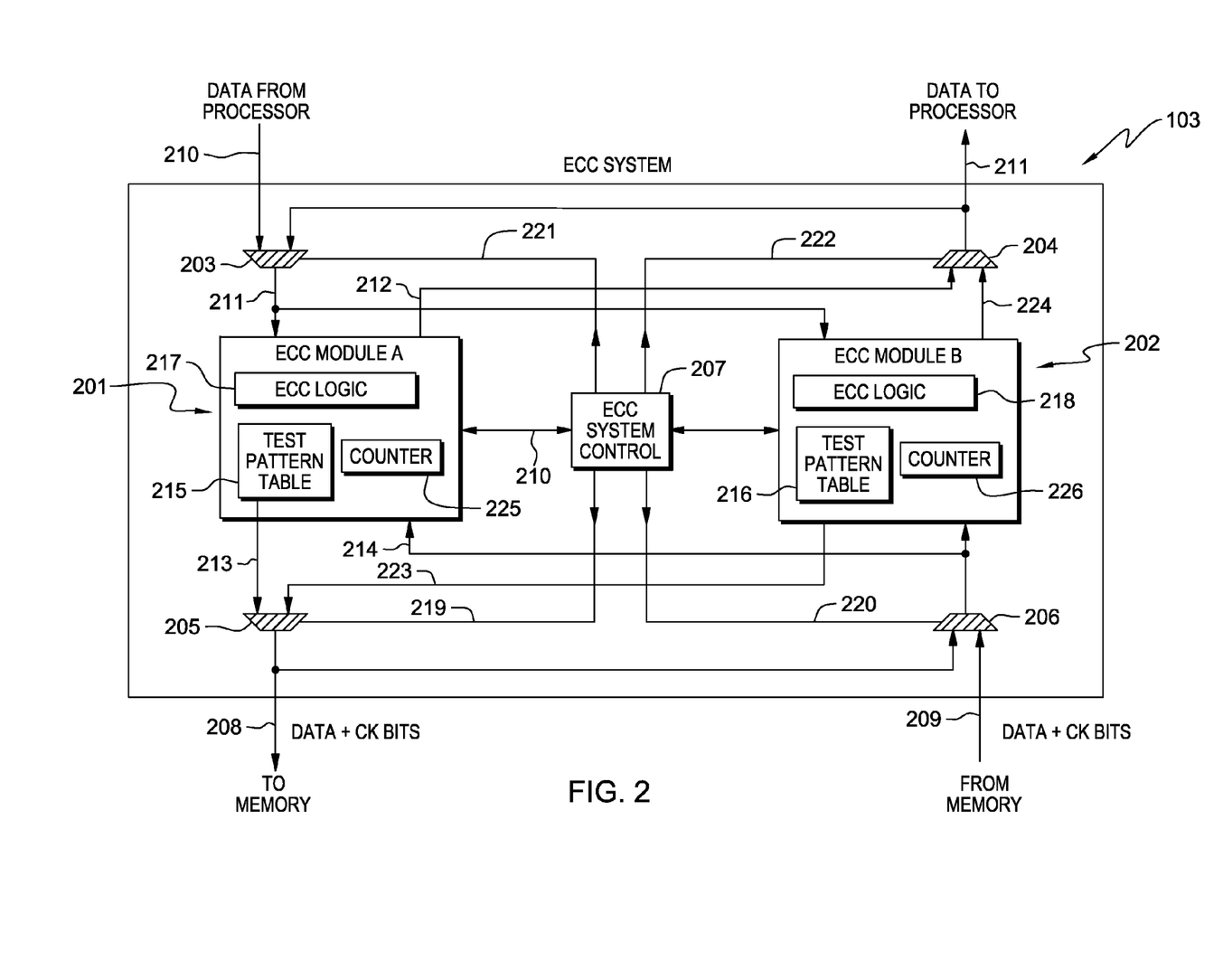
FIG. 2 is a block diagram depicting the Error Correcting Code system in FIG. 1 in detail, in accordance with an embodiment of the present invention.

ECC system control 207 selects input 211 to ECC module A 201 and ECC module B 202 from either bus 210 or bus 211 by conditioning multiplexer 203 via control line 221. ECC system control 207 selects input 214 to ECC module A 201 and ECC module B 202 from either bus 208 or bus 209 by conditioning multiplexer 206 via control line 220. ECC system control 207 selects output 213 from ECC module A 201 or output 223 from ECC module B 202 for output on bus 208 by conditioning multiplexer 205 via control line 219. ECC system control 207 selects output 224 from ECC module B 202 or output 212 from ECC module A 201 for output on bus 211 by conditioning multiplexer 204 via control line 222. Only one ECC module is in operation at any given time in ECC system 103, ECC module A 201 or ECC module B 202. An operating ECC module monitors a number of single bit errors that an ECC logic in an operating ECC module detects and corrects and performs a loop-back test on the ECC logic if a number of single bit errors exceeds a specified threshold or if a double bit error is detected. ECC system control logic 207 monitors an ECC module that is operating in ECC system 103 and may instruct the ECC module to perform a loop-back test on the ECC logic in the ECC module.

In an exemplary embodiment, ECC module A 201 operates until ECC module A 201 fails as determined by a loop-back test that is run on ECC logic 217 in ECC module A 201. If ECC module A 201 fails, ECC system control logic 207 causes ECC module B 202 to perform a loop-back test, and if ECC module B 202 passes the loop-back test, ECC module B 202 assumes operation. If ECC module B 202 fails a loop-back test, ECC system control logic 207 generates a machine check interrupt that notifies an operating system that ECC system 103 has failed.

ECC module A 201 and ECC module B 202 contain test patterns in test pattern table 215 and test pattern table 216 respectively, that are accessed by a loop-back test. A test pattern table is wired in a permanent logic (non-alterable after design) in the exemplary embodiment but may be writeable (alterable after design) by a computer system in other embodiments. A test pattern includes a data bit pattern coupled with a check bit pattern. A loop-back test incorporates two separate tests, a check-bit test and an error detection and correction test to test the functionality of an ECC logic in an ECC module. A check-bit test determines if an ECC logic generates correct check bits for a test pattern of data bits. An error detection and correction test determines if an ECC logic can detect and correct a single bit error and can detect a double bit error in a data bit pattern.

A test pattern used by a check bit test contains a correct check bit pattern for a data bit pattern that the check bit pattern is coupled with in the test pattern. The check bit pattern is a check bit pattern that a correctly functioning ECC logic would generate to be stored in memory with the data in the data bit pattern. A test pattern used by an error detection and correction test contains an incorrect check bit pattern coupled with a data bit pattern in the test pattern. Incorrect check bits associated with a data bit pattern cause a correctly functioning ECC logic to detect a single bit error in a specific bit position or a double bit error in the data bit pattern, depending on a pattern of bits in the incorrect check bit pattern used. By varying an incorrect check bit pattern used in each of a plurality of tests, ECC logic that participates in detecting and correcting an error in each bit position in a data and check bits that are processed by an ECC module is tested for correct function. ECC logic that detects an existence of two erroneous bits in all possible bit position combinations is also tested.

Figure 3:
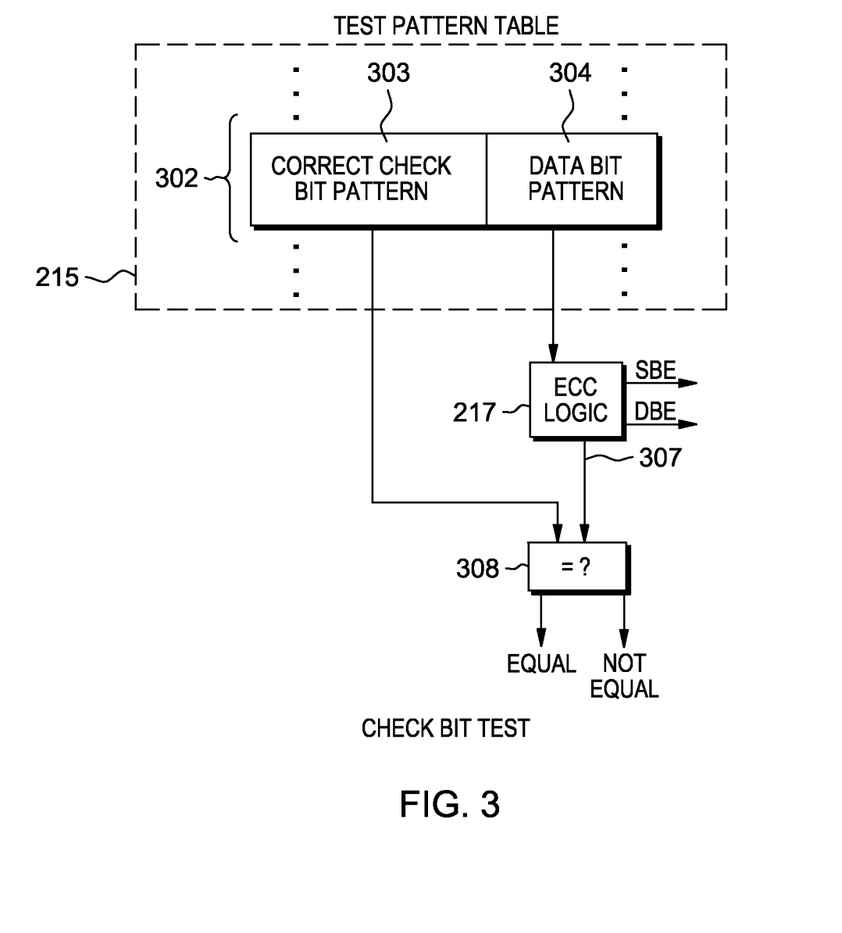
FIG. 3 is a block diagram that depicts information flow in a check bit test, in accordance with an embodiment of the present invention.

FIG. 3 is a block diagram that depicts a flow of information in a check bit test in ECC module A 201. Test pattern 302 is read from test pattern table 215. ECC logic 217 generates check bits 307 from data bit pattern 304 which are compared with correct check bit pattern 303 in comparator 308. If the generated check bits 307 match correct check bit pattern 303, ECC logic 217 operated correctly and passed the check bit test.

Figure 4:
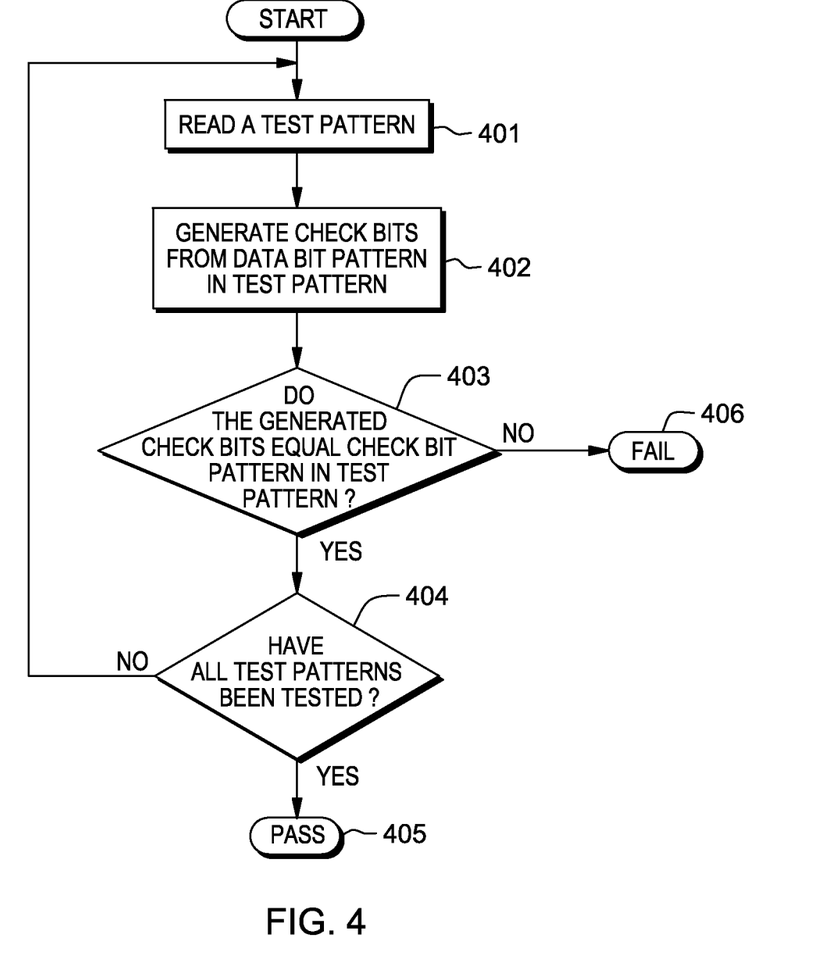
FIG. 4 is a flow chart depicting an operation of a check bit test, in accordance with an embodiment of the present invention.

FIG. 4 depicts a flow diagram of a check bit test that may use one or more test patterns in a check bit test of ECC logic 217. In step 401 a test pattern is read from test pattern table 215. In step 402, check bits are generated from a data bit pattern in the test pattern. In step 403, the generated check bits are compared with a check bit pattern in the test pattern. If the generated check bits do not match the check bit pattern in the test pattern, ECC logic 217 fails the check bit test and the check bit test fails in step 406, otherwise, the check bit test continues until ECC logic 217 has passed a test with each test pattern in the check bit test, determined in step 404, and passes the check bit test in step 405 or until ECC logic 217 fails a test and the check bit test fails in step 406.

Figure 5:
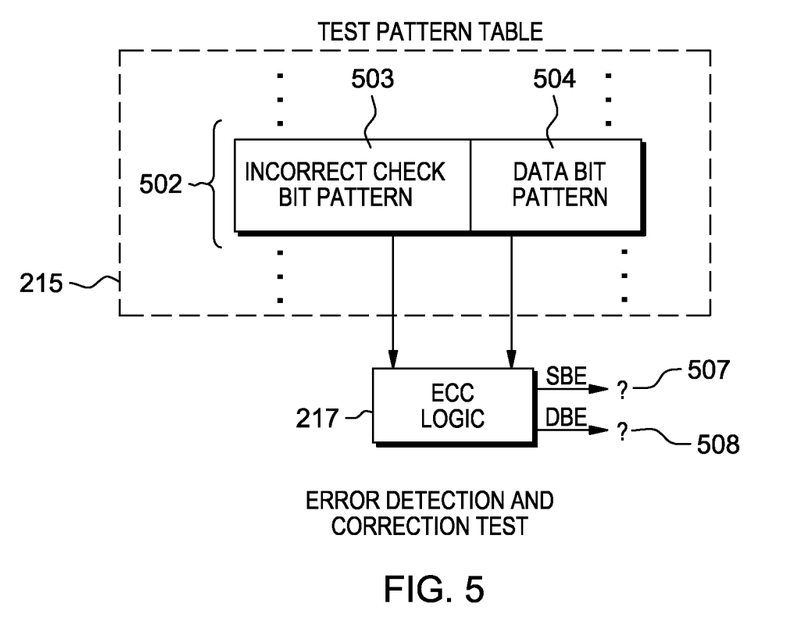
FIG. 5 is a block diagram that depicts information flow in an error detection and correction test, in accordance with an embodiment of the present invention.

FIG. 5 is a block diagram that depicts an example of a flow of information in an error detection and correction test in ECC module A 201. Test pattern 502 is read from test pattern table 215. ECC logic 217 processes check bit pattern 503 and data bit pattern 504 as if data bit pattern 504 and check bit pattern 503 had been read from memory.

Since check bit pattern 503 is incorrect, ECC logic 217 should detect and correct a single bit error 507 or detect a double bit error 508, depending on a function of ECC logic 217 that check bit pattern 503 is intended to test.

Figure 6:
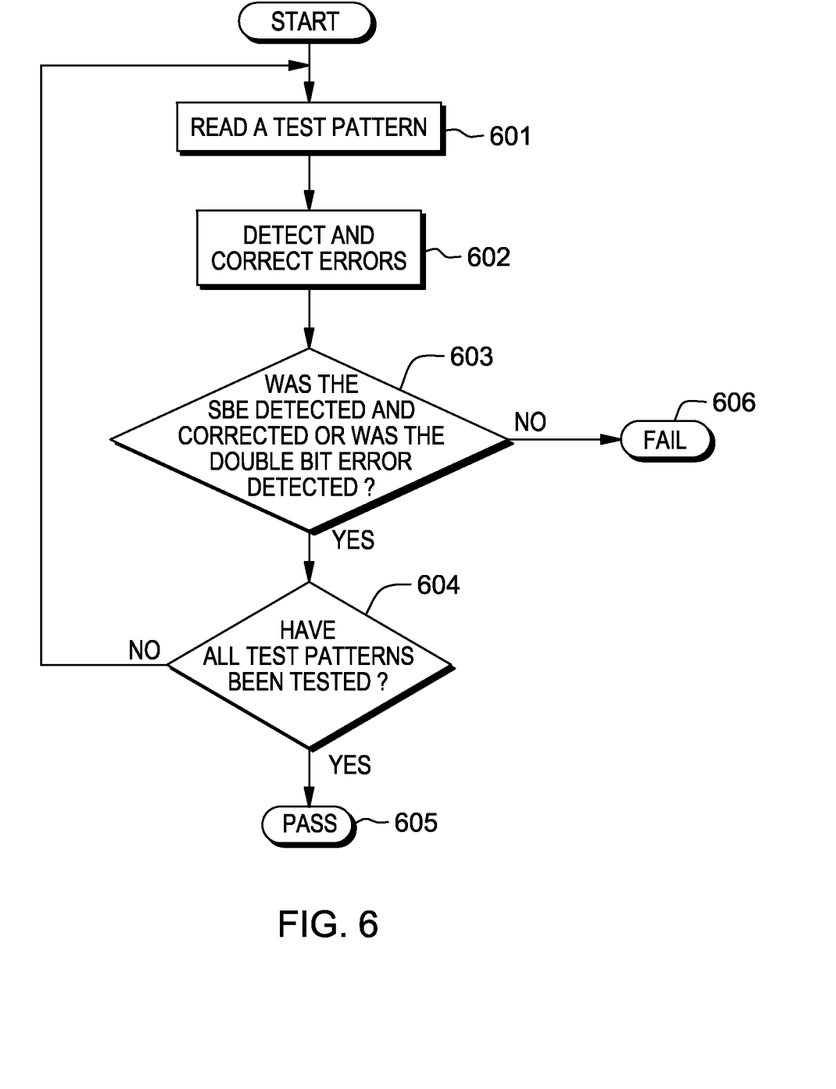
FIG. 6 is a flow chart depicting an operation of an error detection and correction test, in accordance with an embodiment of the present invention.

FIG. 6 depicts an exemplary flow diagram of an error detection and correction test that may use one or more test patterns to test ECC logic 217. In step 601, a test pattern is read from test pattern table 215. In step 602, ECC logic 217 processes a check bit pattern (that is incorrect) and a data bit pattern in the test pattern as if the data bit pattern and the check bit pattern had been read from memory. In step 603, an error that ECC logic 217 may have detected and/or corrected is checked for correctness. If ECC logic 217 generates an incorrect result, ECC logic 217 fails 606 the error detection and correction test, otherwise, the error detection and correction test continues until ECC logic 217 has passed a test with each test pattern in the error detection and correction test, as determined in step 604, and passes the error detection and correction test in step 605, or until ECC logic 217 fails a test and fails the error detection and correction test in step 606.

ECC system 103 may employ the function of ECC module 201 or the function of ECC module 202 as controlled by ECC system control 207. When ECC system 103 is employing the function of ECC module 201, multiplexers 203, 204, 205 and 206, are conditioned by control lines 221, 222, 223, and 220 respectively, to select inputs 210, 212, 213, and 209 respectively as an output. When ECC system 103 is using the function of ECC module 202, multiplexers 203, 204, 205 and 206, are conditioned by control lines 221, 222, 223, and 220 respectively, to select inputs 210, 224, 223, and 209 respectively as an output.

ECC system control 207 conditions multiplexers 203, 204, 205 and 206 with control lines 221, 222, 223, and 220 respectively during a loop-back test to cause an output of an ECC module to be routed to an input of the ECC module. To perform a loop-back test on ECC module A 201, ECC system control 207 uses control bus 210 to initiate a loop-back test on ECC logic 217 in ECC module A 201. Test patterns in test pattern table 215 are output on bus 213 and input to multiplexer 205. ECC system control 207, via control line 219, selects multiplexer input 213 for output on signal bus 208, which is an input to multiplexer 206. ECC control system 207 conditions multiplexer via control line 220 to select input signal lines 208 to be output on signal lines 214. ECC module 201 then reads an input on signal lines 214 as if the input was from memory and performs a check bit test or an error detection and correction test.

In an exemplary embodiment, test patterns in test pattern table 215 are used in a loop-back test on ECC logic 217 and test patterns in test pattern table 216 are used in a loop-back test on ECC logic 218. However, in other embodiments, test patterns in test pattern table 215 may be used in a loop-back test on ECC logic 218 and test patterns in test pattern table 216 may be used in a loop-back test on ECC logic 217. In this case, ECC system control 207 would condition multiplexers 203, 204, 205 and 206 with control lines 221, 222, 223, and 220 respectively to route a test pattern in an ECC module to a different ECC module, doubling a number of test patterns that may be used in a loop-back test.

Figure 7:
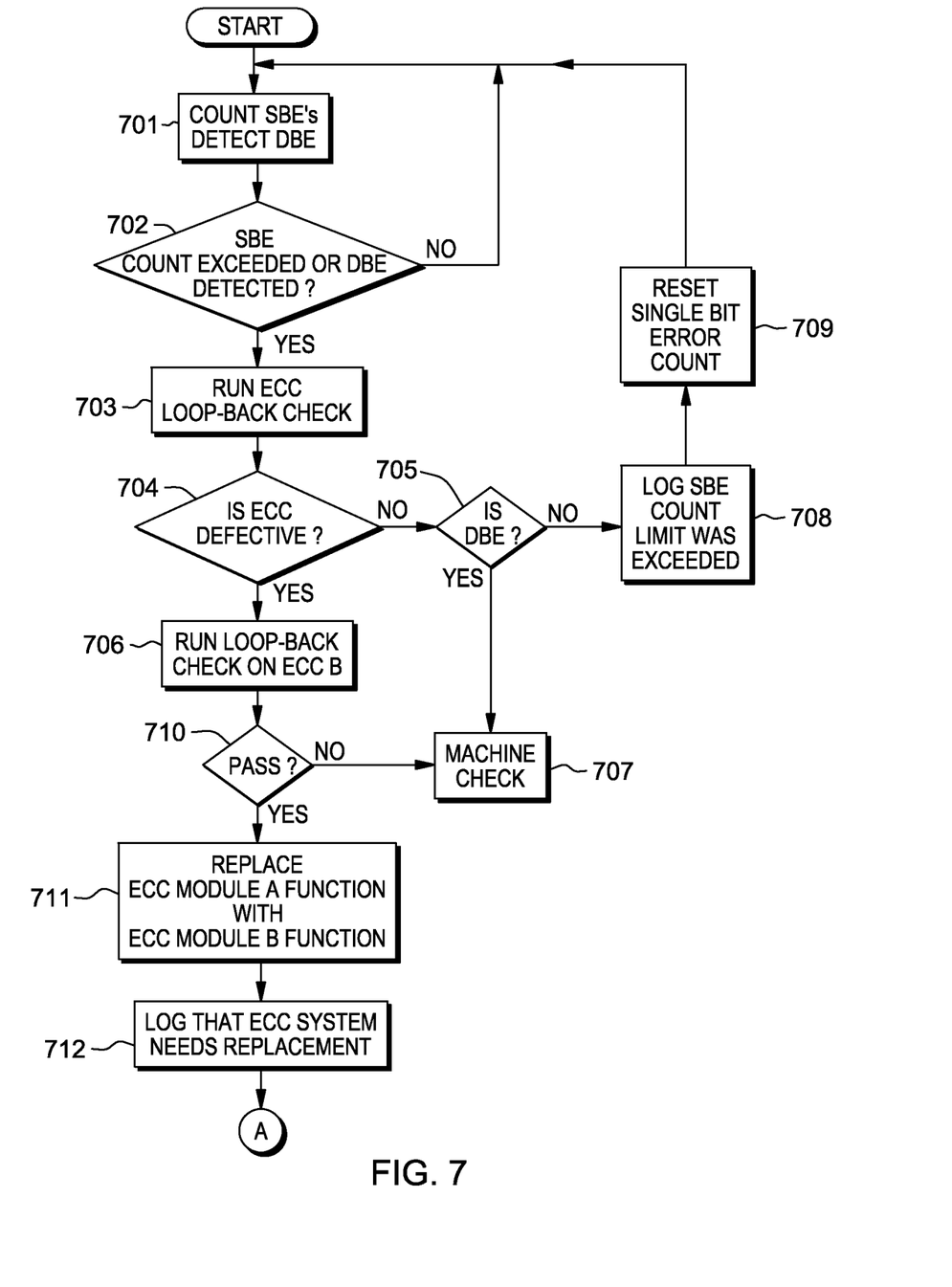
FIG. 7 is a flow chart depicting the operation of an ECC system, in accordance with an embodiment of the present invention.

FIG. 7 is a flow diagram of an operation of ECC system 103. ECC module A 201 is operating in computer system 100 soon after computer system 100 is powered on and if no ECC system 103 errors have yet occurred after computer system 100 is running Single bit errors (SBE) that ECC module A 201 has detected and corrected is counted by counter 225 in step 701, and double bit errors (DBE) are detected. If the number of SBEs does not exceed a specified limit and no DBEs have been detected, ECC system 103 continues operation by continuing to count SBEs and detecting DBEs. In decision step 702 a determination is made if the number of SBEs has exceeded a specified limit or a DBE has been detected. If the number of SBEs has exceeded a specified limit or a DBE has been detected ECC system 103 runs a loop-back check on ECC module 201 in step 703. In decision step 704 a determination is made if ECC module 201 passed or failed the loop-back test. If ECC module 201 passes the loop-back test and a DBE had been detected in step 702, as determined in step 705, a machine check is asserted in step 707. If ECC module 201 fails the loop-back check, as determined in step 704 and a DBE was not detected in step 702, as determined in step 705, an event that a specified number of SBEs is exceeded is logged in step 708, SBE counter 225 is reset to zero in step 709, and ECC module A 201 continues to operate with next step 701.

If in decision step 704 ECC module A 201 is found to be defective because ECC module A 201 failed the loop-back test, a loop-back test is run on ECC module B 202 in step 710 in preparation for ECC module B 202 to replace ECC module A 201. A determination is made in step 710 as to whether ECC module B passed or failed a loop-back test in step 706. If ECC module B failed a loop-back test in step 706, a machine check is asserted in step 707 as ECC system 103 has failed. If ECC module B passed a loop-back test in step 706, ECC system control 207 replaces a function of ECC module A 201 with a function of ECC module 202 in step 711. A fact that ECC system 103 is operating on a backup ECC module 202 and that ECC system 103 needs to be replaced is logged in step 712.

Figure 8:
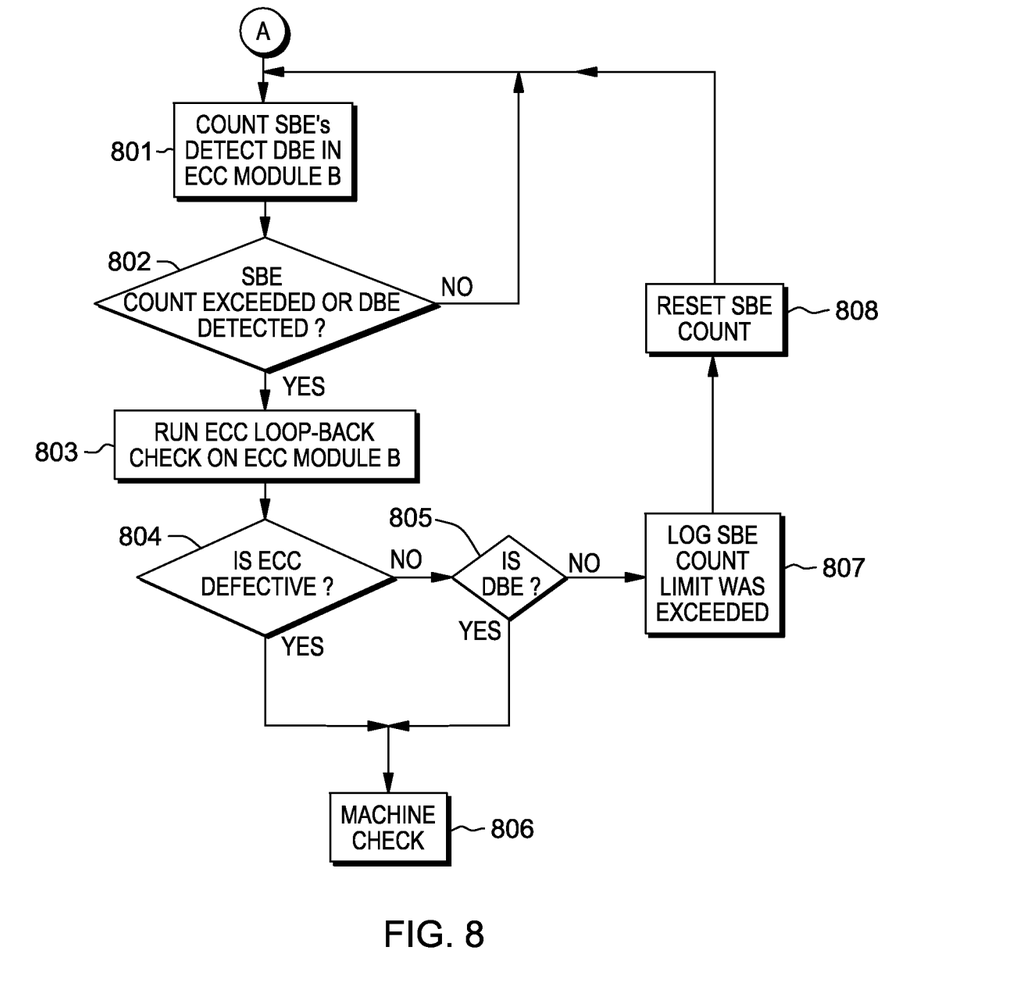
FIG. 8 is a continuation of the flow chart in FIG. 7 depicting the operation of an ECC system, in accordance with an embodiment of the present invention.

If ECC module B 202 is operating in ECC system 103, ECC module A 201 is inoperative. A flow diagram in FIG. 8 depicts the operation of ECC system 103 when ECC module B 202 is operating after replacing ECC module A 201. Single bit errors are detected and corrected and counted by counter 226, and double bit errors are detected in step 801. Decision step 802 determines if a specified number of SBEs is exceeded or a DBE has been detected in ECC module 202, if not, operation continues with step 801. If a specified number of SBEs is exceeded or a DBE is detected in ECC module 202, a loop-back test is run in step 803. A determination is made in step 804 as to whether ECC module 202 passed or failed the loop-back test. If ECC module 202 failed the loop-back test, ECC system 103 has failed and a machine check is asserted. If ECC module 202 passed the loop-back test a determination is made in step 805 as to whether or not a DBE was detected in step 802. If a DBE was detected in step 802, an uncorrectable memory error has occurred and a machine check is asserted. If no DBE was detected in step 802, the fact that a specified limit of SBEs has been exceeded is logged in step 807, SBE counter 226 is reset to zero in step 808, and ECC module B 202 continues to operate with a next step 801.

The forgoing description is an example embodiment only, and those skilled in the art understand that the number of ECC modules in an ECC system can vary, that a number of bits involved in correctable and uncorrectable errors can vary depending on a type of ECC employed, and that tests that are included in a loop-back test can vary in number and nature. In the forgoing embodiment a single bit correction, double bit detection code is assumed, however other embodiments may employ a byte-oriented ECC, e.g., a Single Byte Correction, Double Byte Detection code (SBC-DBD). Byte-oriented ECC is often employed in memory systems that may employ memory components that provide a byte access. A failure of a memory component providing a byte access results in an entire byte of data being in error. Employing SBC-DBD for example, enables a system to continue operation with a failed memory component that has byte access.

Figure 9:
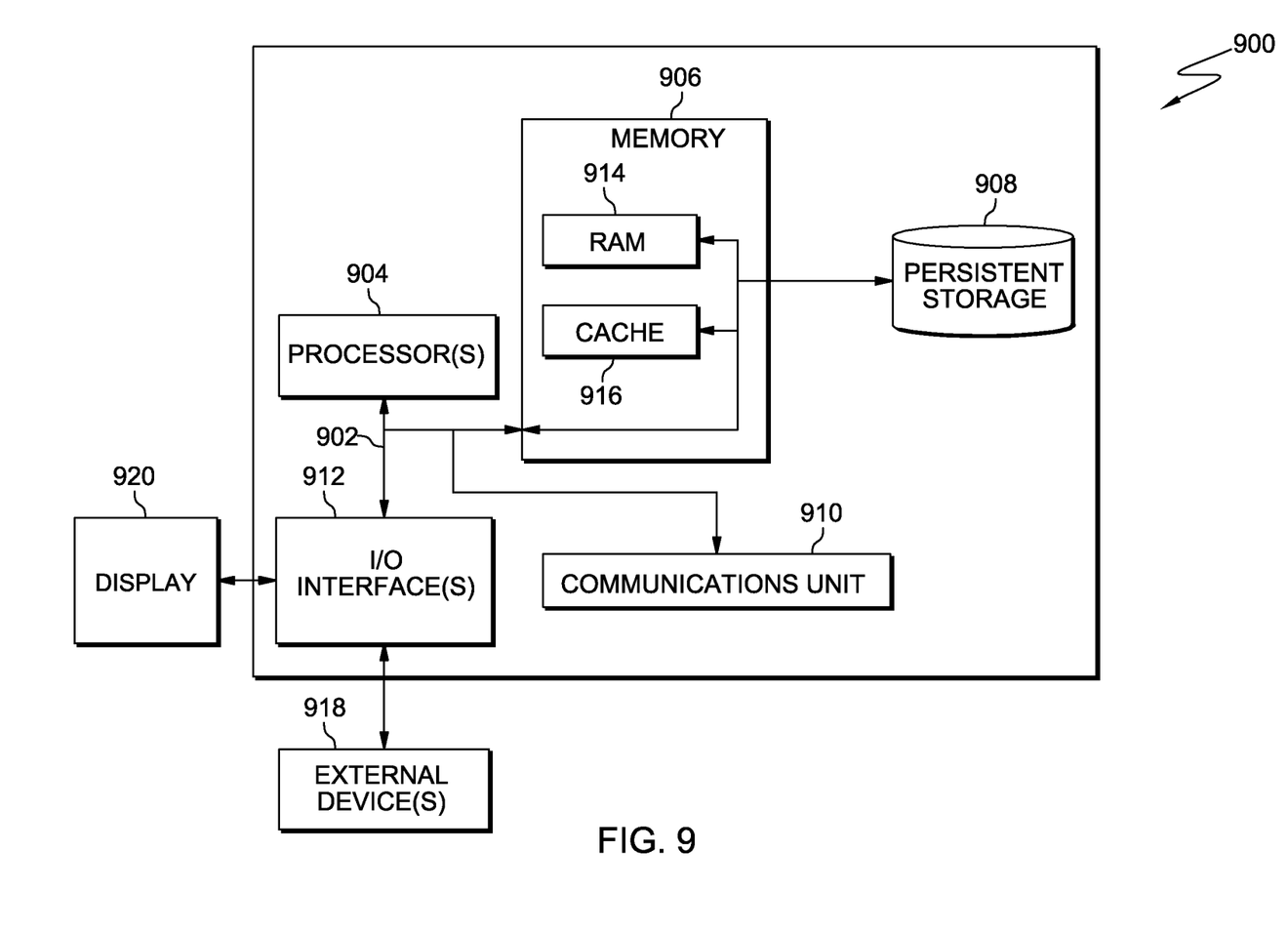
FIG. 9 depicts a block diagram of components of a computing device, in accordance with an embodiment of the present invention.

FIG. 9 depicts a block diagram of components of computer system 900 in accordance with an illustrative embodiment of the present invention. Computer system 900 may incorporate computer system 100. It should be appreciated that FIG. 9 provides only an illustration of one implementation and does not imply any limitations with regard to the environments in which different embodiments may be implemented. Many modifications to the depicted environment may be made.

Computer system 900 includes communications fabric 902, which provides communications between computer processor(s) 904, memory 906, persistent storage 908, communications unit 910, and input/output (I/O) interface(s) 912. Communications fabric 902 can be implemented with any architecture designed for passing data and/or control information between processors (such as microprocessors, communications and network processors, etc.), system memory, peripheral devices, and any other hardware components within a system. For example, communications fabric 902 can be implemented with one or more buses.

Memory 906 and persistent storage 908 are computer-readable storage media. In this embodiment, memory 906 includes random access memory (RAM) 914 and cache memory 916. In general, memory 906 can include any suitable volatile or non-volatile computer-readable storage media.

In this embodiment, persistent storage 908 includes a magnetic hard disk drive. Alternatively, or in addition to a magnetic hard disk drive, persistent storage 908 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 908 may also be removable. For example, a removable hard drive may be used for persistent storage 908. Other examples include optical and magnetic disks, thumb drives, and smart cards that are inserted into a drive for transfer onto another computer-readable storage medium that is also part of persistent storage 908.

Communications unit 910, in these examples, provides for communications with other data processing systems or devices. In these examples, communications unit 910 includes one or more network interface cards. Communications unit 910 may provide communications through the use of either or both physical and wireless communications links.

I/O interface(s) 912 allows for input and output of data with other devices that may be connected to computer system 100. For example, I/O interface 912 may provide a connection to external devices 918 such as a keyboard, keypad, a touch screen, and/or some other suitable input device. External devices 918 can also include portable computer-readable storage media such as, for example, thumb drives, portable optical or magnetic disks, and memory cards. Software and data used to practice embodiments of the present invention, e.g., ECC system 103 can be stored on such portable computer-readable storage media and can be loaded onto persistent storage 908 via I/O interface(s) 912. I/O interface(s) 912 also connects to display 920.

Display 920 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A system for monitoring a first Error Correcting Code (ECC) module for failure and replacing a first ECC module with a second ECC module if the first ECC module fails, the system comprising:
    logic to count both correctable errors and an uncorrectable error detected by a first ECC module and by a second ECC module in data that is read from a memory;
    logic to perform a first loopback test that replaces an input to the first ECC module with an output from the first ECC module; and
    logic to perform a second loopback test that replaces an input to the second ECC module with an output from the second ECC module.

2. The system of claim 1, the system further comprising:
    logic to detect a failed first ECC module with the first loopback test;
    logic to detect a failed second ECC module with the second loopback test; logic to replace the first ECC module with the second ECC module;
    wherein the system is operable to:
        detect that a specified number of correctable errors is exceeded; detect an occurrence of an uncorrectable error;
        perform the first loopback test on the first ECC module if the specified number of correctable errors is exceeded or if an uncorrectable error is detected in the first ECC module;
        perform the second loopback test on the second ECC module if the specified number of correctable errors is exceeded or if an uncorrectable error is detected in the second ECC module; and
        replace the first ECC module that fails the first loopback test with the second ECC module that passes the second loopback test.

3. The system of claim 1, wherein the first loopback test and the second loopback test include a test for a correct generation of check bits, a test for a correct detection and correction of correctable errors, and a test for a detection of a detectable uncorrectable error.

4. The system of claim 1, wherein the logic to perform a first loopback test can replace an input to the first ECC module with an output from the first ECC module or an output from the second ECC module.

5. The system of claim 1, wherein the logic to perform a second loopback test can replace an input to the second ECC module with an output from the first ECC module or an output from the second ECC module.

6. The system of claim 1, wherein the first ECC module and the second ECC module perform single bit correction double bit detection ECC.

7. The system of claim 3, wherein the first ECC module and the second ECC module perform single bit correction double bit detection ECC.

8. The system of claim 1, wherein the first ECC module and the second ECC module perform single byte correction, double byte detection code (SBC-DBD).

9. The system of claim 8, wherein the first loopback test and the second loopback test include a test for a correct generation of check bits, a test for a correct detection and correction of correctable errors, and a test for a detection of a detectable uncorrectable error.

10. A method for monitoring a first Error Correcting Code (ECC) module for failure and for monitoring a second ECC module for failure and replacing the first ECC module with the second ECC module if the first ECC module fails, the method comprising the steps of:
    performing a first loopback test on the first ECC module if a specified number of correctable errors is exceeded or if an uncorrectable error is detected in the first ECC module;
    performing a second loopback test on the second ECC module if the specified number of correctable errors is exceeded or if an uncorrectable error is detected in the second ECC module; and
    replacing the first ECC module that fails the first loopback test with the second ECC module that passes the second loopback test.

11. The method of claim 10, wherein the first loopback test can replace an input to the first ECC module with an output from the first ECC module or an output from the second ECC module.

12. The method of claim 10, wherein the second loopback test can replace an input to the second ECC module with an output from the first ECC module or an output from the second ECC module.

13. The method of claim 10, wherein the first loopback test and the second loopback test include a test for a correct generation of check bits, a test for a correct detection and correction of correctable errors and a test for a detection of a detectable uncorrectable error.

14. The method of claim 10, wherein the first ECC module and the second ECC module perform single bit correction double bit detection ECC.

15. The method of claim 10, wherein the first ECC module and the second ECC module perform single byte correction, double byte detection code (SBC-DBD).

16. A computer program product for monitoring a first Error Correcting Code (ECC) module for failure and for monitoring a second ECC module for failure and replacing the first ECC module with the second ECC module if the first ECC module fails, the computer program product comprising:
    one or more processors, one or more computer-readable memories, one or more computer-readable tangible storage devices, and program instructions stored on at least one of the one or more storage devices for execution by at least one of the one or more processors via at least one of the one or more memories, the program instructions comprising:
        program instructions to perform a first loopback test on a first ECC module if a specified number of correctable errors is exceeded or if an uncorrectable error is detected in a first ECC module;
        program instructions to perform a second loopback test on the second ECC module if the specified number of correctable errors is exceeded or if an uncorrectable error is detected in the second ECC module; and
        program instructions to replace the first ECC module that fails the first loopback test with the second ECC module that passes the second loopback test.

17. The computer program product of claim 15, wherein the program instructions to perform the first loopback test can replace an input to the first ECC module with an output from the first ECC module or an output from the second ECC module.

18. The computer program product of claim 15, wherein the program instructions to perform the second loopback test can replace an input to the second ECC module with an output from the first ECC module or an output from the second ECC module.

19. The computer program product of claim 15, wherein the program instructions to perform the first loopback test and the second loopback test include a test for a correct generation of check bits, a test for a correct detection and correction of correctable errors, and a test for a detection of a detectable uncorrectable error.

20. The computer program product of claim 15, wherein either the first ECC module and the second ECC module perform single bit correction double bit detection ECC, or the first ECC module and the second ECC module perform single byte correction double byte detection ECC.

\* \* \* \* \*